United States Patent [19]

Allan

[11] 4,431,951

[45] Feb. 14, 1984

[54] RESISTANCE THERMAL UNIT FOR THERMAL ELECTRIC ENERGY DEMAND METER

[75] Inventor: Albert W. Allan, Raleigh, N.C.

[73] Assignee: Westinghouse Electric Corp., Pittsburgh, Pa.

[21] Appl. No.: 342,527

[22] Filed: Jan. 25, 1982

[51] Int. Cl.³ .............................................. H02N 10/00
[52] U.S. Cl. ................................... 318/117; 310/307; 60/527
[58] Field of Search ........................ 318/117; 310/307; 60/528, 527

[56] References Cited

U.S. PATENT DOCUMENTS

| | | | |
|---|---|---|---|
| 2,323,738 | 7/1943 | Vassar | 310/307 |
| 2,654,010 | 9/1953 | Hughes | 60/528 |
| 2,980,779 | 4/1961 | Hickle et al. | 60/528 |
| 3,446,998 | 5/1969 | Webb | 60/529 |

Primary Examiner—J. V. Truhe
Assistant Examiner—A. Evans
Attorney, Agent, or Firm—L. P. Johns

[57] ABSTRACT

A resistance thermal unit for a thermal electric energy demand meter responsive to a variable electric quantity characterized by a dielectric housing having a pair of opposed chambers for accommodating a pair of thermal responsive bimetallic spiral springs wound on a common shaft, the springs being effective when heated to rotate the shaft in opposite directions, heating means including a heating element for each spring which element includes a flattened heat resistant dielectric core and an electric-resistant wire spirally wound on the core which wire is connected to spaced load terminals, and the assembly being disposed in a clearance space around each corresponding spring.

5 Claims, 15 Drawing Figures

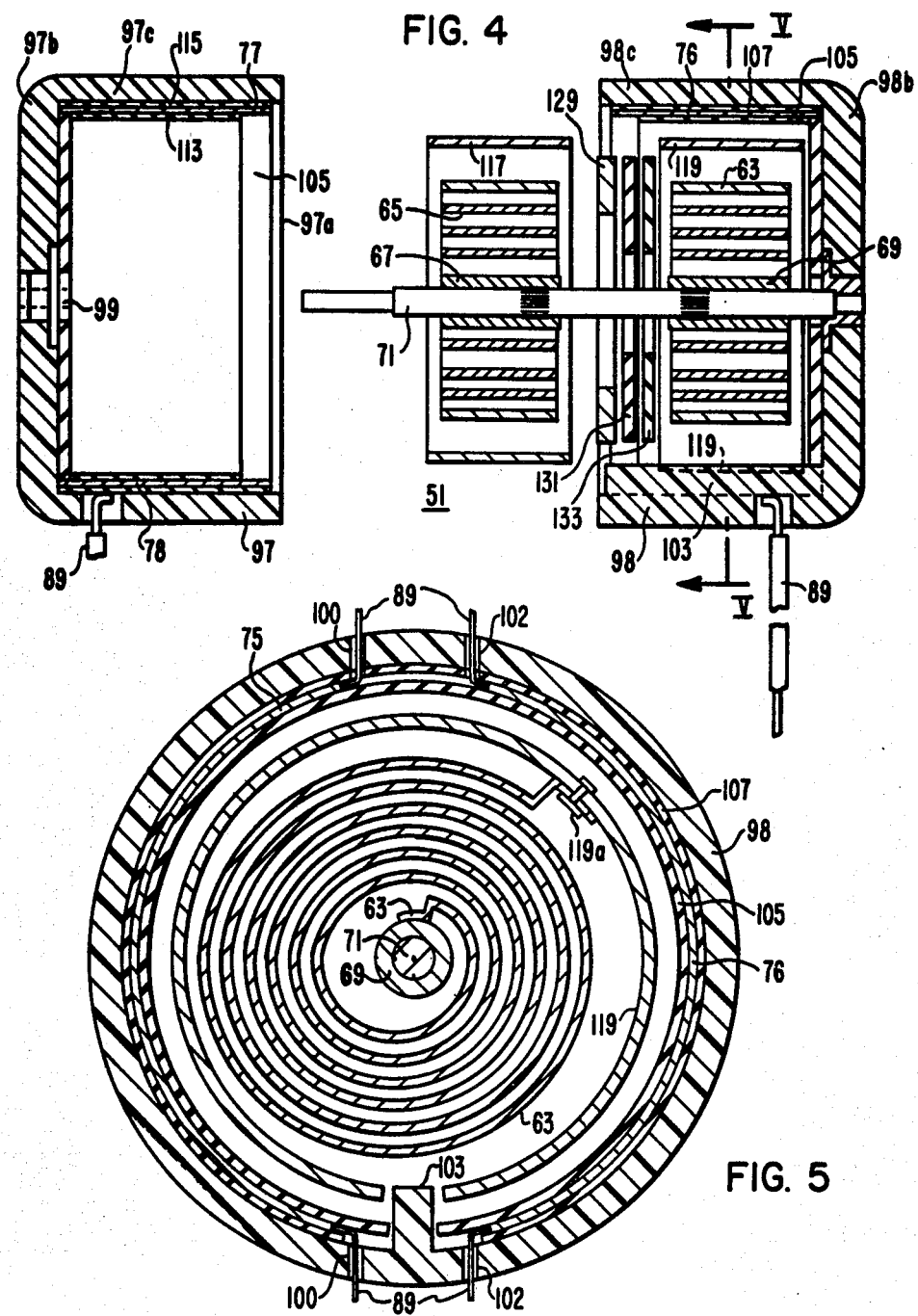

RESISTANCE THERMAL UNIT FOR THERMAL ELECTRIC ENERGY DEMAND METER

BACKGROUND OF THE INVENTION

1. Field of the Invention

This invention relates to electrical measuring instruments and, more particularly, it pertains to the thermal type which is responsive to alternating quantities of electrical energy.

2. Description of the Prior Art

Thermal heater units of prior constructions have involved a variety of forms for measuring different electrical quantities. One known construction comprised heating means associated with a pair of bimetallic springs mounted on a shaft, one spring for rotating the shaft in one direction and another spring for rotating the shaft in the opposite direction. If one of the springs is heated more than the other, the difference in temperature causes the spring to twist the shaft harder than the other whereby the shaft advances a pointer on a scale.

Associated with the foregoing has been a heater comprised of a printed circuit which had a thichness of up to 0.005 inch which was too thin to handle during manufacture and assembly of the heater. As a result a high percentage of the heater was damaged and discarded during assembly.

SUMMARY OF THE INVENTION

It has been found in accordance with this invention that the disadvantages of some thermal heater units of prior construction may be overcome by providing a method for making a resistance heater responsive to a variable electric quantity, comprising the steps of providing a hollow heat-resistant, dielectric, core, wrapping a length of electric-resistant wire spirally onto the core to provide an assembly of a spiral wire on the hollow core, the core having an adhesive surface on which the wire is wound for retaining the wire in place, compressing the assembly to provide a flattened core with spiral wire portions on opposite sides of the core, inserting a flat heat-resistance, dielectric, reinforcing member between the flattened opposite sides of the core with opposite end portions of the member extending from either ends of the assembly, and mounting terminal connection means on each end portion of the member for electrically securing the end portions of the wire to corresponding terminal connection means and for electrically securing a lead wire to each terminal connection means.

The invention also comprises a resistance thermal unit responsive to a variable electric quantity comprising a dielectric housing having a pair of separable cup-shaped sections, each section having a chamber constructed of a solid insulating wall, a shaft mounted by the housing for rotation about an axis, a pair of thermal responsive bimetallic spiral springs wound about the shaft and spaced axially along the shaft, the springs being effective when heated to rotate the shaft in opposite directions, and each spring being disposed in a cup-shaped section with a clearance space adjacent to the housing wall, heating means including a pair of heating elements each having a pair of spaced terminals, each heating element including an assembly of a flattened, heat-resistant, dielectric core and of an electric-resistant wire spirally wound on the core with first opposite end portions connected to corresponding spaced load terminals, and each assembly being disposed in the corresponding clearance space around a corresponding spring.

The advantage of the thermal heater unit of this invention is that a more durable heating element is provided which is capable of being preformed for insertion into a clearance space within a prior existing structure, whereby a more durable device is provided at a minimum of cost.

BRIEF DESCRIPTION OF THE DRAWINGS

FIG. 4 is a partially exploded view showing parts of the device of FIG. 3;

FIG. 5 is a sectional view taken on the line IV—IV of FIG. 4;

DESCRIPTION OF THE PREFERRED EMBODIMENT

Figure 1:
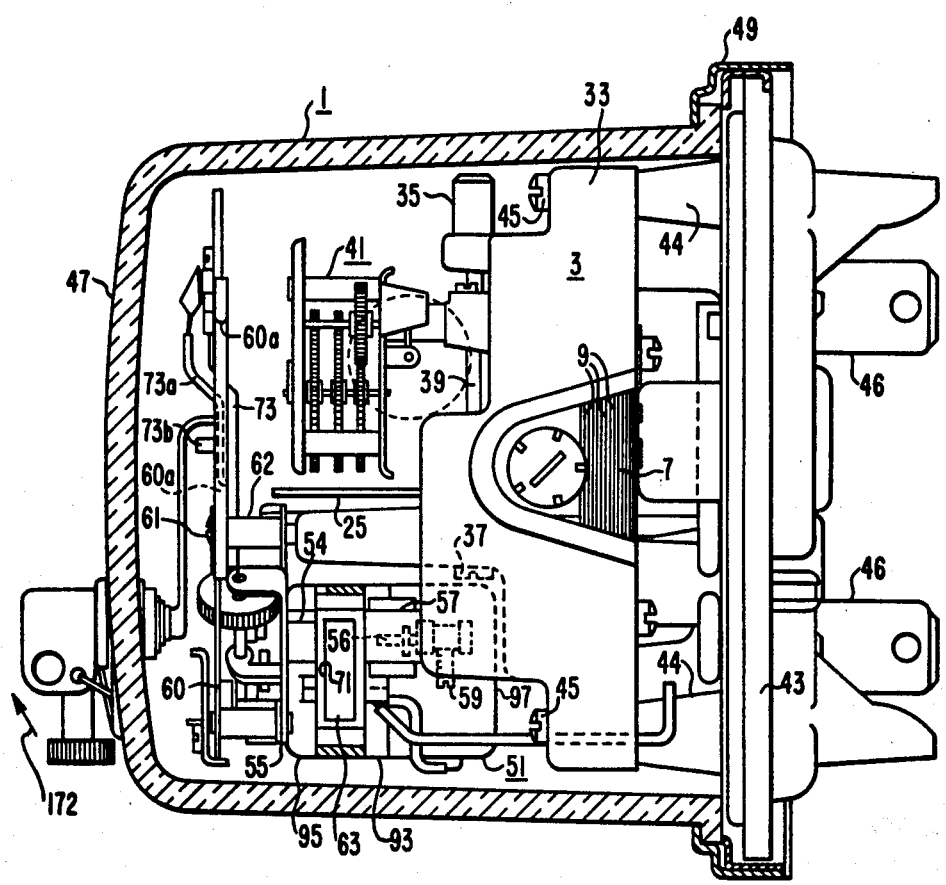
FIG. 1 is a view in side elevation with parts in section of a combination energy and demand measuring instrument.
Figure 2:
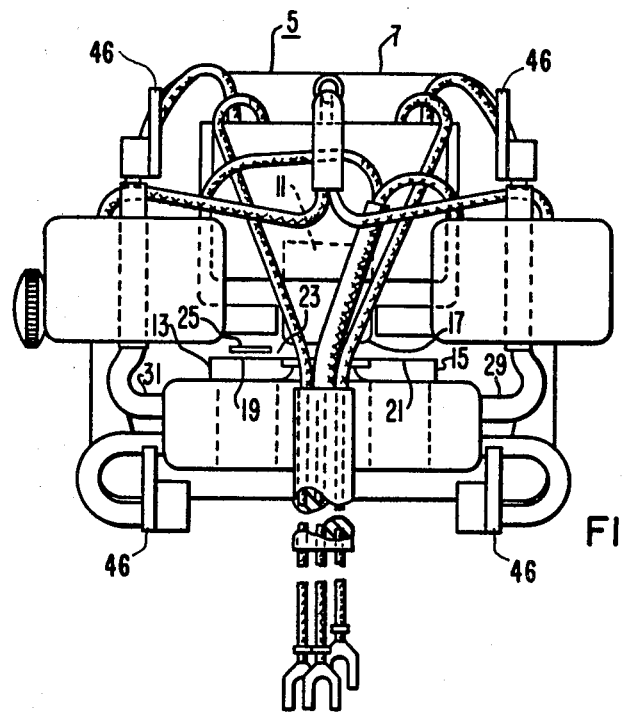
FIG. 2 is a view in rear elevation of the electromagnet of the energy measuring device of FIG. 1.

In FIG. 1 a combination energy and demand measuring instrument is represented generally at 1. The instrument 1 includes an energy measuring device, such as a watthour meter 3 having an electromagnetic structure 5 (FIG. 2) which includes a magnetic structure 7 (FIGS. 1, 2).

The structure 7 includes a plurality of laminations 9 of a suitable material, such as silicon steel. The structure 7 includes a voltage pole 11 (FIGS. 2, 6) and a pair of spaced parallel current poles 13 and 15. The voltage pole 11 includes a pole face 17 which is spaced from the faces 19 and 21 of the current poles to define an air gap 23 through which an electro-conductive disc 25 (FIGS. 1, 2) rotates. To effect energization of the structure 7, the pole 11 includes a voltage winding 27, whereas the poles 13 and 15 are provided with current windings 29 and 31.

A suitable frame 33 supports both the structure 7 and a pair of spaced bearings 35 and 37 that mount a shaft 39 to which the disc 25 is secured for rotation. The frame 33 also supports a suitable register assembly 41.

A base plate 43 (FIG. 1) of insulating material supports the electro-magnet 5 and includes projections 44 to which the frame member 33 is attached by suitable screws 45. The base plate also includes a plurality of openings (not shown) through which extend electro-conductive contact blades 46 which are attached to terminals of the current windings in any suitable manner, such as by welding (FIG. 2). These contact blades are arranged to engage suitable contact jaws of a socket receptacle (not shown).

The instrument is enclosed by a suitable cover 47 preferably formed of a transparent material such as glass. The cover is secured to the base plate 43 by a suitable rim structure 49. A suitable construction for the casing and the socket of a detachable watthour meter is shown in the Bradshaw et al. U.S. Pat. No. 1,969,499.

To measure the maximum demand of an electrical quantity supplied to the watthour meter 3, a demand measuring device 51 is associated with the meter 3 within the same cover 47. Although the device 51 is responsive either to current or energy of a circuit with which the meter 3 is associated, the device 51 is an energy demand measuring device which is responsive to the energy of a three-phase circuit 53 (FIG. 6) to which the meter 3 is connected.

The device 51 (FIGS. 1, 3) is mounted to a pair of spaced projections 54 of a support plate 55. Only one of these projections include threaded openings for receiving screws 56 which are supported by a riveted eyelet of the device 51 as will appear hereinafter. Additional spaced projections 57 of the plate 55 extend through openings (not shown) of the frame 33 and are secured thereto by screws 59. A face plate 60 is secured to the plate 55 as by screws 61 which are threadably received in threaded openings of extensions 62 of the plate 55. The plate 60 is provided with an opening 60a through which the register 41 is exposed for viewing.

The device 51 (FIGS. 1, 3, 4) includes two bimetallic spiral springs 63 and 65 having their inner ends attached respectively to hubs 69 and 67. The hubs are attached to a common shaft 71 which carries a pusher are 73 (FIG. 3) for rotation therewith. A bimetallic spring is formed of two dissimilar metals or alloys having different coefficients of thermal expansion. Consequently, when the bimetallic springs are heated, their inner ends tend to rotate relative to the outer ends which are fixed in permanent positions by means which will be described hereinafter.

For controlling the temperature of the springs 63 and 65, four identical heaters 75, 76, 77, 78 are associated therewith. Each spring 63, 65 is heated by two heaters (FIG. 5). for example, the spring 63 has two heaters 75, 76.

The springs 63 and 65 are so mounted that when heated, they urge the shaft 71 in opposite directions of rotation. Consequently, variations in temperature which affect both springs equally have no appreciable effect on the rotation of the shaft 71 and the pusher arm 73 associated with the shaft. This means that ambient temperature variations have little effect on the accuracy of the device 51.

The heaters 75, 76, 77, 78 are disposed in the form of semicircles which surround the springs in concentric relation therewith. Inasmuch as the heaters are of identical construction, only two of the heaters are described.

Figure 8:
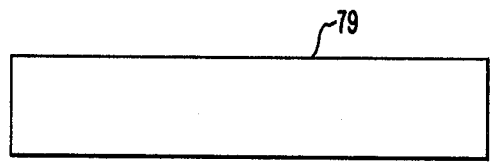
FIG. 8 is a side view of a tubular core.
Figure 9:
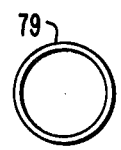
FIG. 9 is an end view of the core of FIG. 8.
Figure 10:
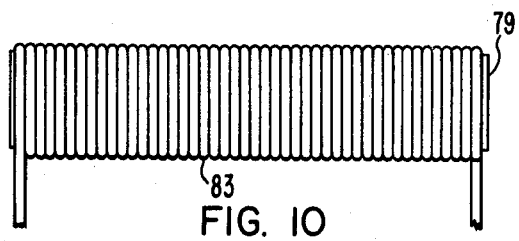
FIG. 10 is a side view of the assembly of an electric-resistant wire wound on the core.
Figure 11:
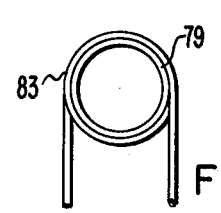
FIG. 11 is an end view of the FIG. 10 assembly.
Figure 12:
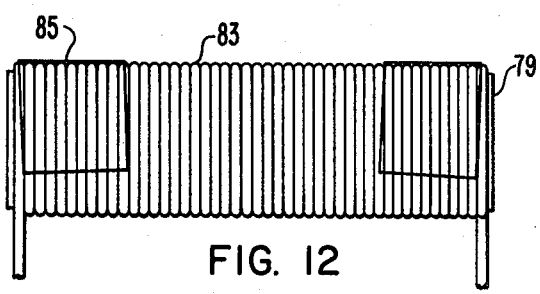
FIG. 12 is a side view of the flattened assembly of FIGS. 10 and 11.
Figure 13:
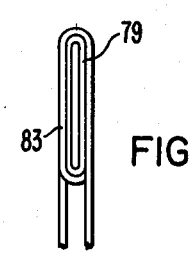
FIG. 13 is an end view thereof.

In accordance with this invention the heater 75 (FIGS. 14, 15), for example, comprises a core 79, a reinforcing member 81, and a wound wire 83. The construction of the heater 75 is best described by illustrating the method by which it is made which includes the steps of (1) providing a tubular core 79 (FIGS. 8, 9), (2) winding a wire 83 (FIGS. 10, 11), onto the tubular core 79, (3) flattening, such as crushing, the assembly of the core and wire, and (4) inserting a reinforcing member 81 (FIG. 15) into the crushed core 79 (FIGS. 12, 13).

The core 79 is comprised of a heat resistant, dielectric material, such as a polymide. It is preferably provided as a tube or cylinder by wrapping a length of 0.002 inch thick tape around a mandrel having a diameter of about 0.290 inch. The tape is wrapped with the adhesive side out with overlapping portions of about 0.080 inch.

The wire 83 is an electric resistance wire having a diameter of about 0.008 inch and an approximate length of 100 inches. The exact length (turns) is readily controlled to give an overall resistance of 100 ohms±¼ ohm. The wire 83 is wound upon the outer adhesive surface of the round core 79 to enable proper spacing of succeeding turns of the wire onto the core. To facilitate subsequent handling similar pieces 85 of a tape, such as transparent tape, are temporarily attached to hold the end turns of the wire intact. Thereafter, the assembly of the tubular core 79 and wire 83 is removed from a mandrel (not shown) and then flattened between two plates until a gap of approximately 0.011–0.012 inch remains in the center of the core (or sleeve) 79 (FIG. 13).

Figure 14:
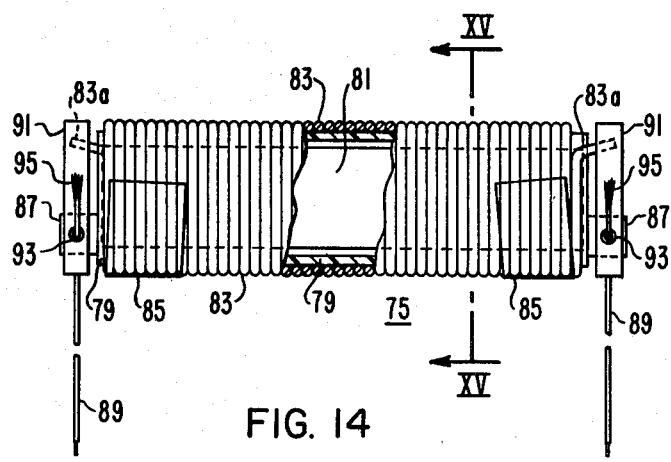
FIG. 14 is a side view of the heating element of this invention.
Figure 15:
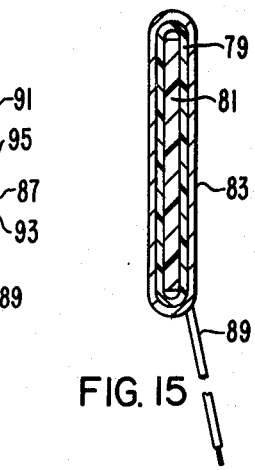
FIG. 15 is an end view of FIG. 14, enlarged to show the parts in detail.

A member or strip 81 is then inserted into the flattened core or sleeve 79 (FIGS. 14, 15). The member 81, having a thickness of approximately 0.010 inch, serves as a reinforcing body for the core and sleeve assembly and is comprised of a heat resistant dielectric material, such as Mylar.

The overall assembly of the core 79, member 81, and wound wire 83 for each heater has a overall thickness of about 0.035 inch and is susceptible to bowing or bending into an arcuate shape or semicircle for insertion around the bimetallic spiral spring 63 (FIG. 4). As shown in FIG. 14 the member 81 includes a pair of similar tabs 87, one extending from each opposite end of the member for connecting opposite end portions 83a to corresponding lead wires 89. For that purpose a metal clip 91 is attached to each tab 87 where it is secured by a rivet 93. Opposite end portions 83a of the wire 83 are secured to corresponding clips 91 and each lead wire 89 extends through the hollow rivet with an end portion electrically connected, such as by a weld 95, to the clip, whereby a circuit extends from one lead wire 89 through the corresponding clip 91 to opposite end portions 83a and thence through the wire 83 to the other opposite end portion 83a, the clip 91 and the other lead wire 89.

The operating parts of the device 51 are enclosed in a suitable housing 96 (FIG. 3) which is of two-part construction including housing parts 97 and 98 each formed of a suitable heat insulating material. The housing parts are of substantially identical construction each being of cup-shaped configuration (FIG. 4) with open ends 97a and 98a and closed ends 97b and 98b. These ends are connected by annular side walls 97c and 98c. The housing parts are mounted in engagement with their open ends adjacent each other such that the housing parts are separable in a direction which is parallel to the axis of the shaft 71. The parts 97 and 98 may be secured together in any suitable manner such as by a rivet (not shown). Each of the housing parts provides an enclosure for housing a separate spring and heater assembly. Suitable bearings 99 and 101 are positioned in openings of the closed ends of the housing parts to mount the shaft 71 for rotation.

The heaters 75, 76, 77, 78 (FIGS. 4, 5) are mounted respectively in the housing parts 97 and 98 adjacent the inner surfaces of the side walls of the housing parts with the terminal conductors of the heaters extending through suitable openings 100 and 102 in the side walls of the housing parts. The lead wires 89 (FIG. 5) of the heaters 75, 76 are spaced to provide a passage through which a rib 103 of the housing part 98 extends. A similar construction is provided in the housing part 98.

In order to obtain desired operating characteristics the device 51 includes a number of spacers and insulators for controlling the transmission of heat between the springs and heaters. In the present invention these spacers and insulators surround the shaft to facilitate assembly thereof. Electrical insulators 105 and 107 of tubular configuration are positioned in engagement with the heaters 75, 76 concentrically therewith. The insulators 105 and 107 serve to insulate the housing part 98 from the heaters 75, 76 and are located concentrically with respect to the heaters. Additional insulators 113 and 115 of tubular configuration are similarly positioned between the heaters 77, 78, metallic rings 117 and part 97 to further assist in securing the proper time interval curve.

As shown in FIGS. 4 and 5, a pair of metallic rings 117 and 119 are positioned to surround respectively the springs 63 and 65. The outer ends of the bimetallic springs are attached to the rings 117 and 119, as shown for ring 119 (FIG. 5) in any suitable manner, such as a rivet 119a. Each of the items 105, 107, 113, 115, 117, 119 are split construction to receive the ribs 103 (FIG. 5) of the housing parts which serve to prevent rotation of these items.

Intermediate the springs 63 and 65 are located a circular insulating spacer 129 and circular insulating members 131 and 133 (FIG. 4). The spacer 129 may be formed of cork and the members 131 and 133 constructed of a phenolic resin. The items 129, 131, 133 are split construction to receive the ribs 103 to prevent rotation of these items.

Rotation of the shaft 71 and of the pusher arm 73 is determined by the difference in temperatures of the springs 63 and 65. By proper energization of the heaters the rotation of the shaft and the pusher arm may be made dependent on energy flowing through the meter 3. Circuit connections suitable for this purpose are illustrated in FIGS. 6 and 7.

Figure 6:
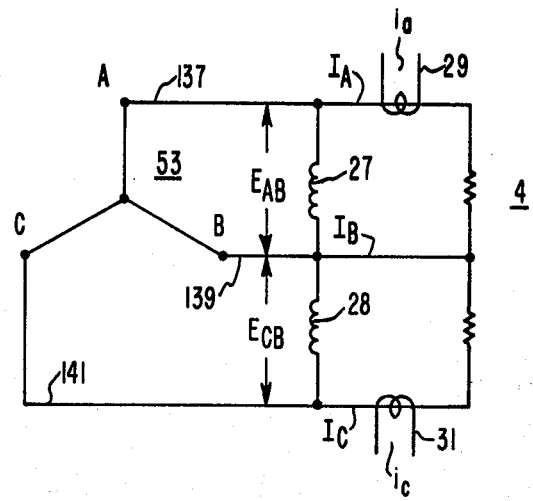
FIG. 6 is a circuit diagram showing the meter of FIGS. 1-4 connected to measure electrical demand of a load.

A three-phase alternating current circuit is represented generally by the numeral 53 in FIG. 6. This circuit includes three conductors 137, 139, 141 feeding a load 4. In FIG. 7 the voltage windings 27 and 28 and the current windings 29 and 31 are shown associated with this circuit for the purpose of measuring energy flowing to the load 4. For this purpose the winding 27 is connected across the conductors 137, 139 and the winding 28 is connected across the conductors 139, 141, whereas the windings 29, 31 are connected respectively in series with the conductors 137, 141.

Figure 7:
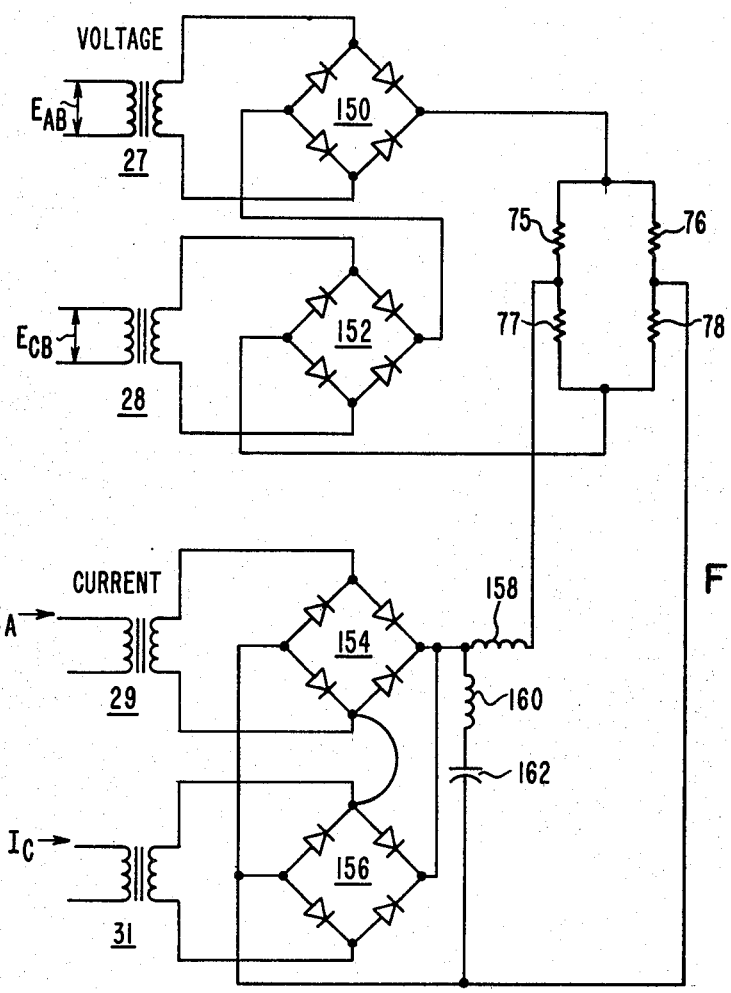
FIG. 7 is an internal schematic diagram of the meter shown in FIGS. 1-4.

A voltage signal comprising the output of the windings 27 and 28 as rectified by diode bridges 150 and 152 is applied to the network of heaters 75, 76, 77, 78 (FIG. 7). A current signal comprising the output of windings 29 and 31 as rectified by diode bridges 154 and 156 is applied through a reactive network comprising coils 158 and 160 and capacitor 162 to provide a more accurate and effective current signal. The output of the reactive network is also connected to the heater 75, 76, 77, 78 (FIG. 7). the heaters 75, 76, 77, 78 form a resistive bridge circuit and when fed by the current and voltage signals herein described produce an accurate kVA demand measurement.

Rotation of the shaft 71 may be shown in any desired manner. For example, a maximum demand pointer 73a may be mounted for rotation over the face plate 60. In the embodiment illustrated in FIG. 1, the pointer 73a may be frictionally mounted in the path of a portion of the arm 73 to be actuated thereby. It is noted that a portion 73b of the arm 73 extends through the opening 60a of the plate 60 to engage the pointer 73a when the arm 73 is rotated. Consequently, the pointer 73a takes a position which corresponds to the maximum rotation of the arm 73 during any desired period. The arm 73 also includes a part 73a which extends through the opening 60 to provide an indication of the demand at any given time.

At the end of this period, the pointer 73a may be reset by means of a resetting knob 74 which cooperates with a shaft 74a projecting through the cover 47. This shaft carries a spring arm 74b which is located in the path of the pointer 73a. When the knob 74 is pivoted through 90° in the direction of the arrow 172, rotation of the knob about a horizontal axis effects rotation of the shaft 74a which carries the spring arm 74b into engagement with the pointer 73a for returning the pointer into engagement with a zero stop (not shown). At this point the arm 74b slips over the pointer 73a to leave the pointer free for further actuation by the arm 73.

Figure 3:
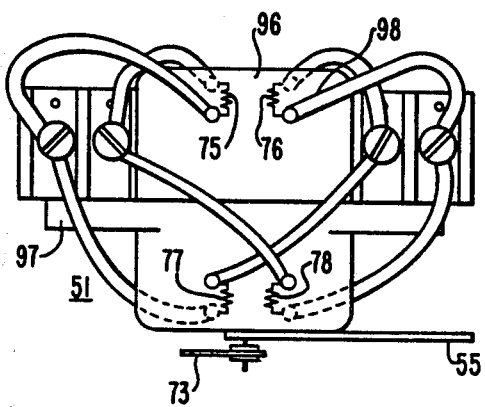
FIG. 3 is a plan view of the demand measuring device of FIG. 1.

As illustrated in FIG. 3, the several conductors associated with the windings and the current transformers are located at the rear of the structure 7 to provide a very compact and near appearing arrangement.

What is claimed is:

1. A resistance thermal unit responsive to a variable electric quantity comprising:
    (a) a housing formed of dielectric material,
    (b) a shaft mounted by the housing for rotation about an axis,
    (c) a pair of thermoresponsive bimetallic spiral springs wound about the shaft and spaced axially along the shaft, the springs being effective when heated to rotate the shaft in opposite directions,
    (d) the housing having a pair of separable cup-shaped sections each having a chamber constructed of a solid insulating wall and accommodating a separate one of the springs, each section enclosing a clearance space concentrically around the corresponding spring,
    (e) heating means including a pair of heating elements each having a pair of spaced terminals, each heating element including an arcuate assembly of a flattened, heat-resistant, dielectric core and of an electric-resistant wire spirally wound on the core with first opposite end portions connected to corresponding spaced load terminals, and
    (f) one assembly being disposed in the clearance space around each corresponding spring.

2. The device of claim 1 in which the surface of the core has an adhesive surface.

3. The device of claim 1 in which each section has open ends substantially abutting and being separable in a direction parallel to the axis to expose the springs.

4. The device of claim 1 in which the flattened core is comprised of two separate sides between which a flat heat-resistant, dielectric reinforcing member is disposed.

5. The device of claim 4 in which the reinforcing member includes second opposite end portions extending beyond the ends of the spirally wound wire and of the core, and each second opposite end portion mounting a load terminal to which a corresponding first opposite end portion is electrically connected.

* * * * *